United States Patent
Khlat et al.

(10) Patent No.: US 10,985,702 B2
(45) Date of Patent: Apr. 20, 2021

(54) ENVELOPE TRACKING SYSTEM

(71) Applicant: Qorvo US, Inc., Greensboro, NC (US)

(72) Inventors: Nadim Khlat, Cugnaux (FR); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/421,905

(22) Filed: May 24, 2019

(65) Prior Publication Data
US 2020/0136561 A1    Apr. 30, 2020

Related U.S. Application Data

(60) Provisional application No. 62/753,521, filed on Oct. 31, 2018.

(51) Int. Cl.
| | |
|---|---|
| H03G 3/20 | (2006.01) |
| H03F 1/02 | (2006.01) |
| H03F 3/213 | (2006.01) |
| H03F 3/195 | (2006.01) |

(52) U.S. Cl.
CPC .......... *H03F 1/0227* (2013.01); *H03F 3/195* (2013.01); *H03F 3/213* (2013.01); *H03F 2200/102* (2013.01)

(58) Field of Classification Search
CPC ..... H03F 1/0211; H03F 1/0216; H03F 1/0222
USPC ................................................. 330/127, 136
See application file for complete search history.

(56) References Cited

U.S. PATENT DOCUMENTS

| | | |
|---|---|---|
| 5,838,732 A | 11/1998 | Carney |
| 6,107,862 A | 8/2000 | Mukainakano et al. |
| 6,141,377 A | 10/2000 | Sharper et al. |
| 6,985,033 B1 | 1/2006 | Shirali et al. |
| 7,043,213 B2 | 5/2006 | Robinson et al. |
| 7,471,155 B1 | 12/2008 | Levesque |
| 7,570,931 B2 | 8/2009 | McCallister et al. |
| 8,461,928 B2 | 6/2013 | Yahav et al. |
| 8,493,141 B2 | 7/2013 | Khlat et al. |
| 8,588,713 B2 | 11/2013 | Khlat |
| 8,718,188 B2 | 5/2014 | Balteanu et al. |
| 8,725,218 B2 | 5/2014 | Brown et al. |
| 8,774,065 B2 | 7/2014 | Khlat et al. |

(Continued)

FOREIGN PATENT DOCUMENTS

EP    3174199 A2    5/2017

OTHER PUBLICATIONS

Non-Final Office Action for U.S. Appl. No. 14/836,634, dated May 16, 2016, 9 pages.

(Continued)

*Primary Examiner* — Steven J Mottola
(74) *Attorney, Agent, or Firm* — Withrow & Terranova, P.L.L.C.

(57) ABSTRACT

An envelope tracking system is disclosed having an envelope tracking integrated circuit (ETIC) with a first tracker having a first supply output and a second tracker having a second supply output, wherein the ETIC has a first mode in which only one of the first and second trackers supplies voltage and a second mode in which the first and second trackers both supply voltage. A first notch filter is coupled to the first supply output and a second notch filter is coupled to the second supply output. A mode switch coupled between the first supply output and the second supply output is configured to couple the first notch filter and the second notch filter in parallel in the first mode and open the mode switch to decouple the first notch filter from the second notch filter in the second mode in response to first and second switch control signals, respectively.

20 Claims, 4 Drawing Sheets

(56) References Cited

U.S. PATENT DOCUMENTS

| | | |
|---|---|---|
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,989,682 B2 | 3/2015 | Ripley et al. |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,830 B2 | 10/2015 | Camuffo et al. |
| 9,167,514 B2 | 10/2015 | Dakshinamurthy et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,230 B2 | 2/2016 | Henshaw et al. |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,377,797 B2 | 6/2016 | Kay et al. |
| 9,379,667 B2 | 6/2016 | Khlat et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 | 4/2017 | Krug |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,923,520 B1 | 3/2018 | Abdelfattah et al. |
| 10,003,416 B1 | 6/2018 | Lloyd |
| 10,090,808 B1 | 10/2018 | Henzler et al. |
| 10,097,145 B1 | 10/2018 | Khlat et al. |
| 10,110,169 B2 | 10/2018 | Khesbak et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,181 B2 | 5/2019 | Kim et al. |
| 10,326,408 B2 | 6/2019 | Khlat et al. |
| 10,382,071 B2 * | 8/2019 | Rozek .................. G05F 3/02 |
| 10,476,437 B2 | 11/2019 | Nag et al. |
| 2002/0167827 A1 | 11/2002 | Umeda et al. |
| 2004/0266366 A1 | 12/2004 | Robinson et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0240786 A1 | 10/2006 | Liu |
| 2007/0052474 A1 | 3/2007 | Saito |
| 2007/0258602 A1 | 11/2007 | Vepsalainen et al. |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0308919 A1 | 12/2010 | Adamski et al. |
| 2011/0074373 A1 | 3/2011 | Lin |
| 2011/0136452 A1 | 6/2011 | Pratt et al. |
| 2011/0175681 A1 | 7/2011 | Inamori et al. |
| 2011/0279179 A1 | 11/2011 | Vice |
| 2012/0194274 A1 | 8/2012 | Fowers et al. |
| 2012/0200435 A1 | 8/2012 | Ngo et al. |
| 2012/0299645 A1 | 11/2012 | Southcombe et al. |
| 2012/0299647 A1 | 11/2012 | Honjo et al. |
| 2013/0021827 A1 | 1/2013 | Ye |
| 2013/0100991 A1 | 4/2013 | Woo |
| 2013/0130724 A1 | 5/2013 | Kumar Reddy et al. |
| 2013/0162233 A1 | 6/2013 | Marty |
| 2013/0187711 A1 | 7/2013 | Goedken et al. |
| 2013/0200865 A1 | 8/2013 | Wimpenny |
| 2013/0271221 A1 | 10/2013 | Levesque et al. |
| 2014/0009226 A1 | 1/2014 | Severson |
| 2014/0028370 A1 | 1/2014 | Wimpenny |
| 2014/0028390 A1 | 1/2014 | Davis |
| 2014/0057684 A1 | 2/2014 | Khlat |
| 2014/0103995 A1 | 4/2014 | Langer |
| 2014/0155002 A1 | 6/2014 | Dakshinamurthy et al. |
| 2014/0184335 A1 | 7/2014 | Nobbe et al. |
| 2014/0199949 A1 | 7/2014 | Nagode et al. |
| 2014/0210550 A1 | 7/2014 | Mathe et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0155836 A1 | 6/2015 | Midaya et al. |
| 2015/0188432 A1 | 7/2015 | Vannorsdel et al. |
| 2015/0236654 A1 | 8/2015 | Jiang et al. |
| 2015/0236729 A1 | 8/2015 | Peng et al. |
| 2015/0280652 A1 | 10/2015 | Cohen |
| 2015/0333781 A1 | 11/2015 | Alon et al. |
| 2016/0065137 A1 | 3/2016 | Khlat |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0294587 A1 | 10/2016 | Jiang et al. |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2019/0044480 A1 | 2/2019 | Khlat |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0222178 A1 | 7/2019 | Khlat et al. |
| 2019/0238095 A1 | 8/2019 | Khlat |
| 2019/0267956 A1 * | 8/2019 | Granger-Jones .......... H03F 3/68 |
| 2019/0222175 A1 | 10/2019 | Khlat et al. |
| 2020/0007090 A1 | 1/2020 | Khlat et al. |
| 2020/0036337 A1 | 1/2020 | Khlat |
| 2020/0106392 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |

OTHER PUBLICATIONS

Non-Final Office Action for U.S. Appl. No. 14/868,890, dated Jul. 14, 2016, 13 pages.

(56) References Cited

OTHER PUBLICATIONS

Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl. No. 16/155,127, dated Jun. 1, 2020, 8 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Final Office Action for U.S. Appl. No. 15/888,300, dated Feb. 15, 2019, 15 pages.
Final Office Action for U.S. Appl. No. 16/122,611, dated Sep. 18, 2020, 17 pages.
Notice of Allowance for U.S. Appl. No. 16/246,859, dated Sep. 18, 2020, 8 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Final Office Action for U.S. Appl. No. 16/284,023, dated Nov. 3, 2020, 7 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Quayle Action for U.S. Appl. No. 16/589,940, dated Dec. 4, 2020, 8 pages.
Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 16/689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.

* cited by examiner

FIG. 4

ENVELOPE TRACKING SYSTEM

RELATED APPLICATIONS

This application claims the benefit of provisional patent application Ser. No. 62/753,521, filed Oct. 31, 2018, the disclosure of which is hereby incorporated herein by reference in its entirety.

FIELD OF THE DISCLOSURE

The embodiments disclosed herein relate to power management systems for supplying power to radio frequency amplifiers.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools to being sophisticated mobile multimedia centers that enable enhanced user experiences.

The redefined user experience requires a higher data rate offered by wireless communication technologies, such as fifth-generation new radio (5G-NR) and wireless fidelity (Wi-Fi), that typically operate in higher frequency spectrums. To achieve higher data rates with increased robustness in the higher frequency spectrums, sophisticated power amplifiers (PAs) may be employed to increase output power of radio frequency signals while maintaining sufficient energy per bit prior to transmitting the radio frequency signals.

Envelope tracking is a power management technology designed to improve efficiency levels of the PAs to help reduce power dissipation in the mobile communication devices. An envelope tracking integrated circuit (ETIC) is configured to generate a modulated voltage that keeps track of a target voltage envelope and provides the modulated voltage to the PAs for amplifying the radio frequency signal(s). However, the ETIC has output impedance that can interact with a load of the PAs, particularly at a higher modulation bandwidth (e.g., >100 MHz). Consequently, the modulated voltage may be degraded nonlinearly, thus leading to harmonic frequencies being created outside the modulation bandwidth. As such, there is an increasing need to better control the output impedance of the ETIC in order to attenuate associated harmonic frequencies with the higher modulation bandwidth.

SUMMARY

An envelope tracking system is disclosed having an envelope tracking integrated circuit (ETIC) having a first tracker with a first supply output and a second tracker with a second supply output. The ETIC has a first mode in which only one of the first tracker and the second tracker is supplying voltage and a second mode in which the first tracker and the second tracker are both supplying voltage. A first notch filter is coupled between the first supply output and a fixed voltage node such as ground. A second notch filter is coupled between the second supply output and the fixed voltage node. A switch is coupled between the first supply output and the second supply output. The switch is configured to receive a first switch control signal that closes the switch to electrically couple the first notch filter and the second notch filter in parallel when the ETIC is in the first mode and a second switch control signal that opens the switch to electrically decouple the first notch filter from the second notch filter when the ETIC is in the second mode.

In exemplary embodiments, the envelope tracking system further includes a switch controller. The switch controller is configured to generate the first switch control signal in response to the ETIC operating in the first mode and generate the second control in response to the ETIC operating in the second mode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
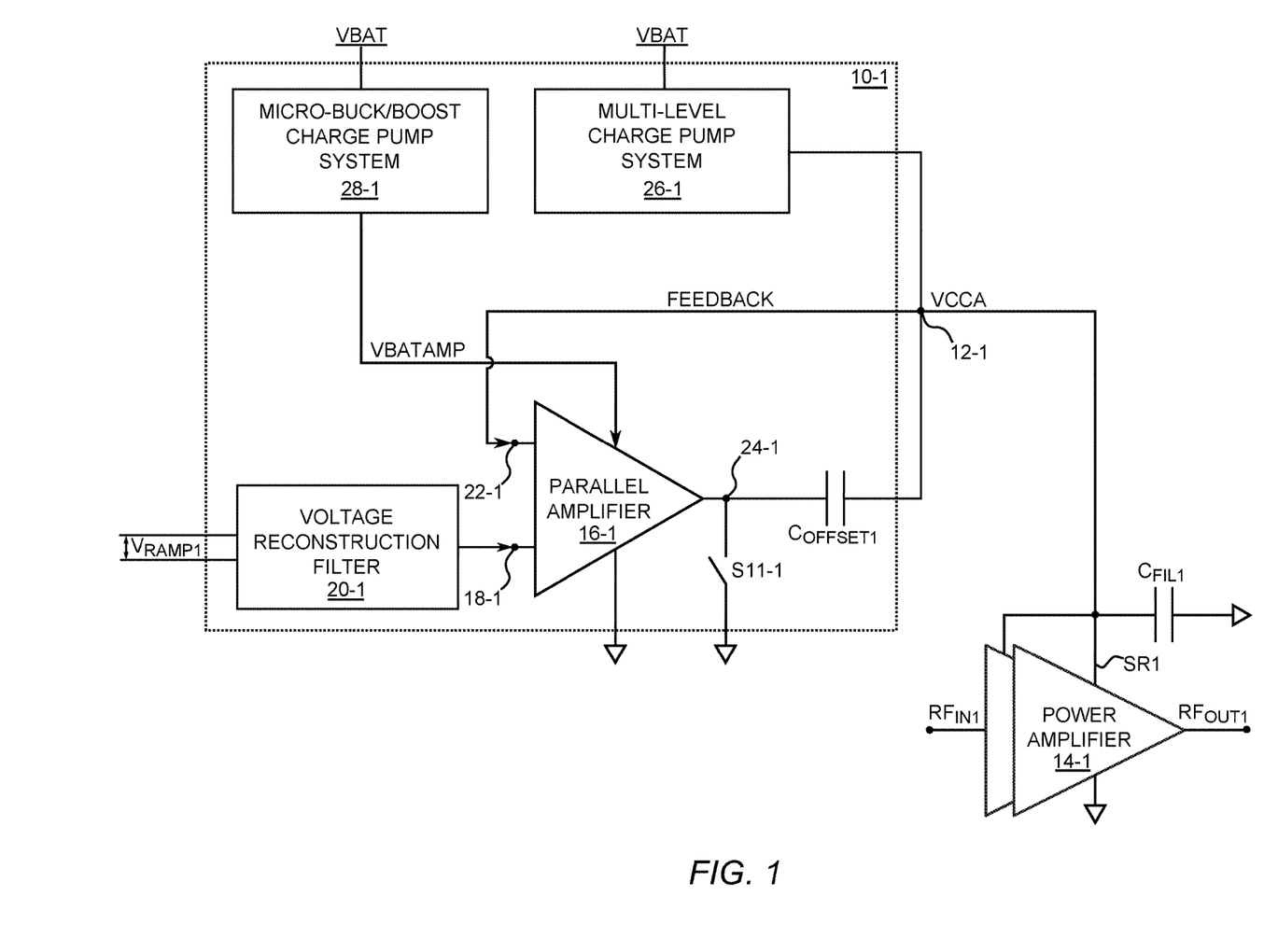
FIG. 1 is a block diagram of a first tracker of a dual tracker type envelope tracking integrated circuit.

FIG. 1 is a block diagram of a first tracker 10-1 of a dual tracker type envelope tracking integrated circuit (ETIC) having a first supply output 12-1 that is coupled to a first supply rail SR1 of a first power amplifier 14-1. A first filter capacitor $C_{FIL1}$ is coupled between the first supply rail SR1 and a fixed voltage node such as ground. The first power amplifier 14-1 receives an RF signal to be amplified on a first RF input terminal $RF_{IN1}$ and outputs an amplified version of the RF signal on a first RF output terminal $RF_{OUT1}$.

The first tracker 10-1 also includes a first parallel amplifier 16-1 that is configured to control a first modulated voltage VCCA that supplies power to the first power amplifier 14-1. The first parallel amplifier 16-1 has a first signal input terminal 18-1 coupled to a first voltage reconstruction filter 20-1 that outputs a reconstructed and filtered version of a first envelope tracking signal $V_{RAMP1}$ that the first parallel amplifier 16-1 amplifies to modulate power being supplied to the first power amplifier 14-1. The first parallel amplifier 16-1 has a first feedback input terminal 22-1 that is coupled to the first supply output 12-1. Feedback from the first supply output 12-1 forces an output voltage at a first output terminal 24-1 of the first parallel amplifier 16-1 to follow the first envelope tracking signal $V_{RAMP1}$. A first offset capacitor $C_{OFFSET1}$ is coupled between the first output terminal 24-1 and the first supply output 12-1. A first discharge switch S11-1 is coupled between the first output terminal 24-1 and the fixed voltage node. The first discharge switch S11-1 may be momentarily closed to discharge the first offset capacitor $C_{OFFSET1}$.

A first multi-level charge pump system 26-1 provides power to the first power amplifier 14-1 through the first supply output 12-1. Raw power for the first multi-level charge pump system 26-1 is typically provided by a battery source VBAT. The battery source VBAT may also provide power through a first micro-buck/boost charge pump system 28-1 that provides a supply voltage VBATAMP to the first parallel amplifier 16-1.

Figure 2:
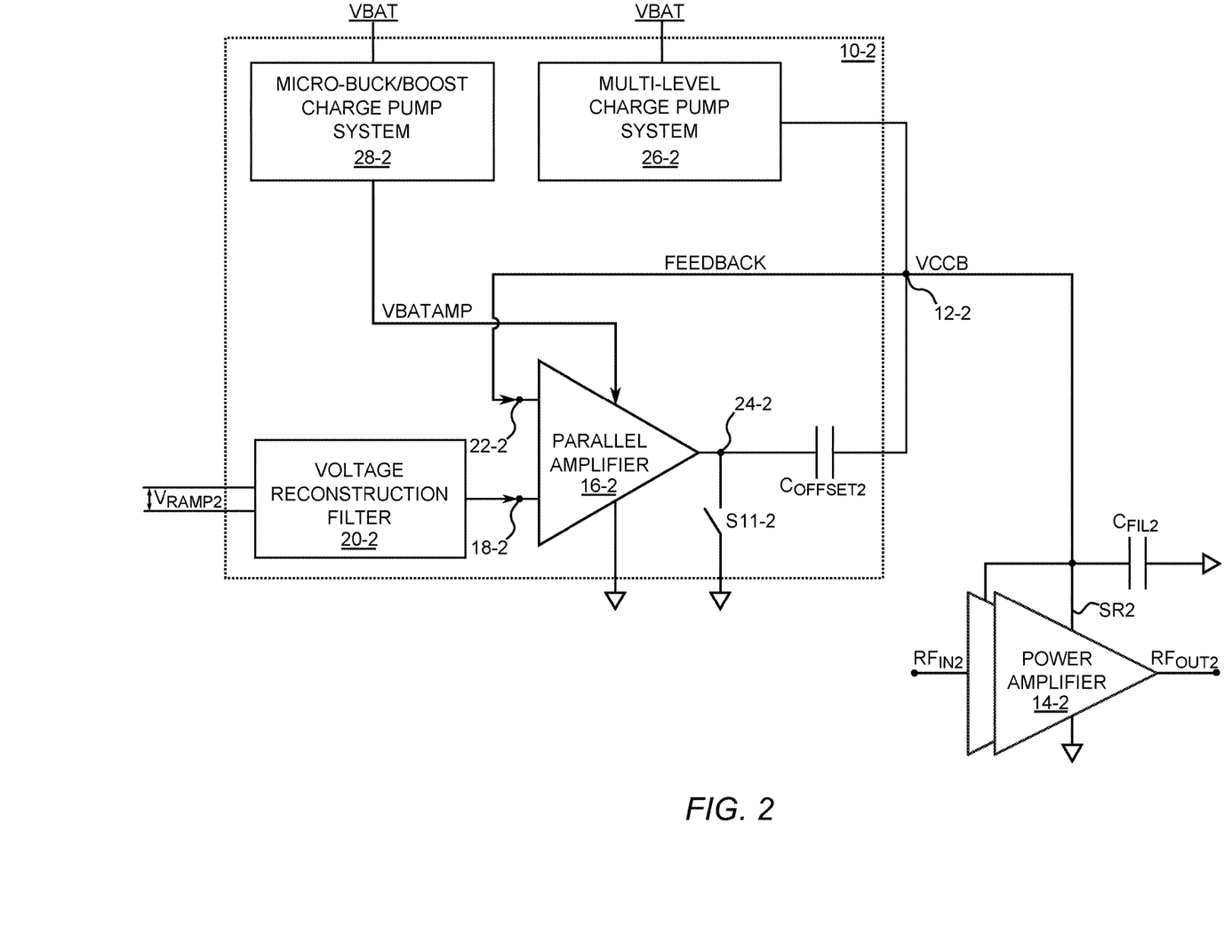
FIG. 2 is a block diagram of a second tracker that is structured similarly to the first tracker.

FIG. 2 is a block diagram of a second tracker 10-2 having a second supply output 12-2 that is coupled to a second supply rail SR2 of a second power amplifier 14-2. A second filter capacitor $C_{FIL2}$ is coupled between the second supply rail SR2 and the fixed voltage node, which in this exemplary embodiment is ground. The second power amplifier 14-2 receives an RF signal to be amplified on a second RF input terminal $RF_{IN2}$ and outputs an amplified version of the RF signal on a second RF output terminal $RF_{OUT2}$.

The second tracker 10-2 also includes a second parallel amplifier 16-2 that is configured to control a second modulated voltage VCCB that supplies power to the second power amplifier 14-2. The second parallel amplifier 16-2 has a second signal input terminal 18-2 coupled to a second voltage reconstruction filter 20-2 that outputs a reconstructed and filtered version of an second envelope tracking signal $V_{RAMP2}$ that the second parallel amplifier 16-2 amplifies to modulate power being supplied to the second power amplifier 14-2. The second parallel amplifier 16-2 has a second feedback input terminal 22-2 that is coupled to the second supply output 12-2. Feedback from the second supply output 12-2 forces an output voltage at a second output terminal 24-2 of the second parallel amplifier 16-2 to follow the second envelope tracking signal $V_{RAMP2}$. A second offset capacitor $C_{OFFSET2}$ is coupled between the second output terminal 24-2 and the second supply output 12-2. A second discharge switch S11-2 is coupled between the second output terminal 24-2 and the fixed voltage node. The second discharge switch S11-2 may be momentarily closed to discharge the second offset capacitor $C_{OFFSET2}$.

A second multi-level charge pump system 26-2 provides power to the second power amplifier 14-2 through the second supply output 12-2. Raw power for the second multi-level charge pump system 26-2 is typically provided by the battery source VBAT. The battery source VBAT may also source power through a second micro-buck/boost charge pump system 28-2 that provides a supply voltage VBATAMP to the second parallel amplifier 16-2.

Figure 3:
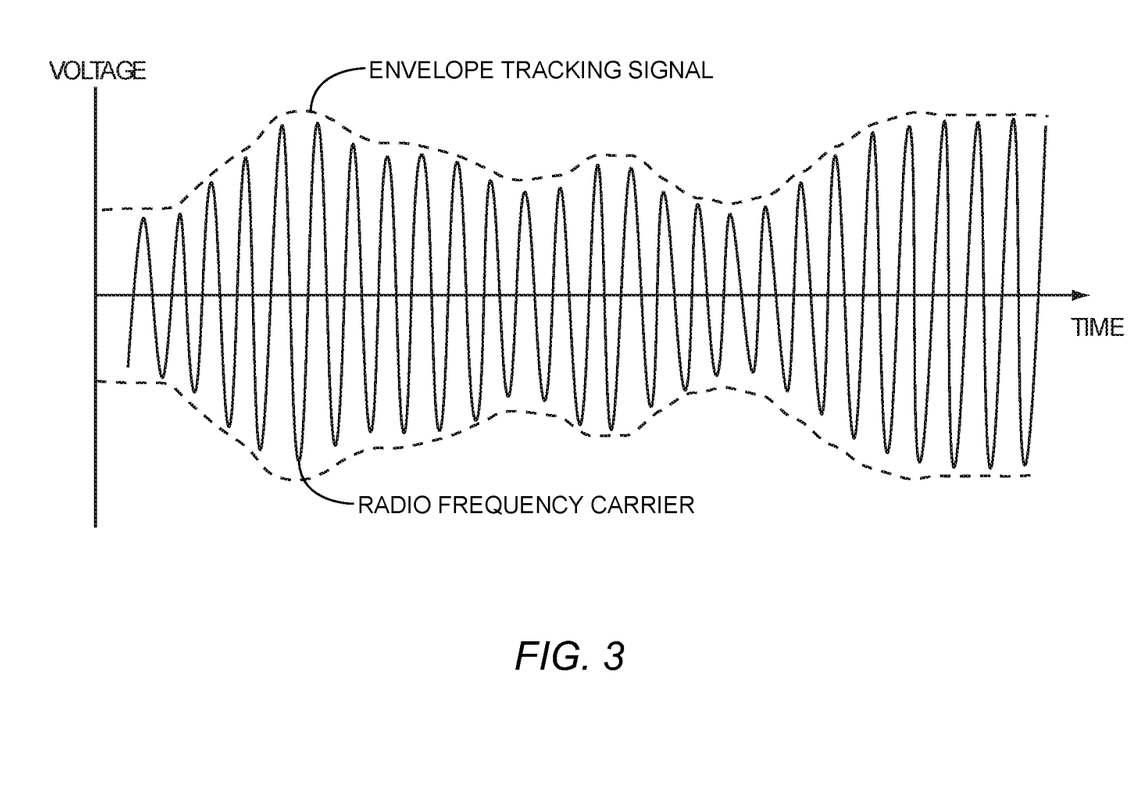
FIG. 3 is an exemplary diagram of an envelope tracking signal that tracks amplitude modulation of a radio frequency signal that is amplified by one or more amplifier stages.

FIG. 3 is an exemplary diagram of an envelope tracking signal that tracks amplitude modulation of a radio frequency carrier signal that is amplified by one or more amplifier stages such as the first power amplifier 14-1 (FIG. 1). It is desirable for the envelope tracking signal to be in synchronization with the amplitude modulation of the radio frequency signal. However, with regard to very wide modulation bandwidth such as 5G-NR 100 MHz, a problem exists in that the modulated voltage may be degraded nonlinearly, thus leading to harmonic frequencies being created outside the modulation bandwidth. As such, there is an increasing need to better control the output impedance of the first tracker 10-1 of FIG. 1 and the second tracker 10-2 of FIG. 2 in order to attenuate associated harmonic frequencies with the higher modulation bandwidth required by 5G-NR.

Figure 4:
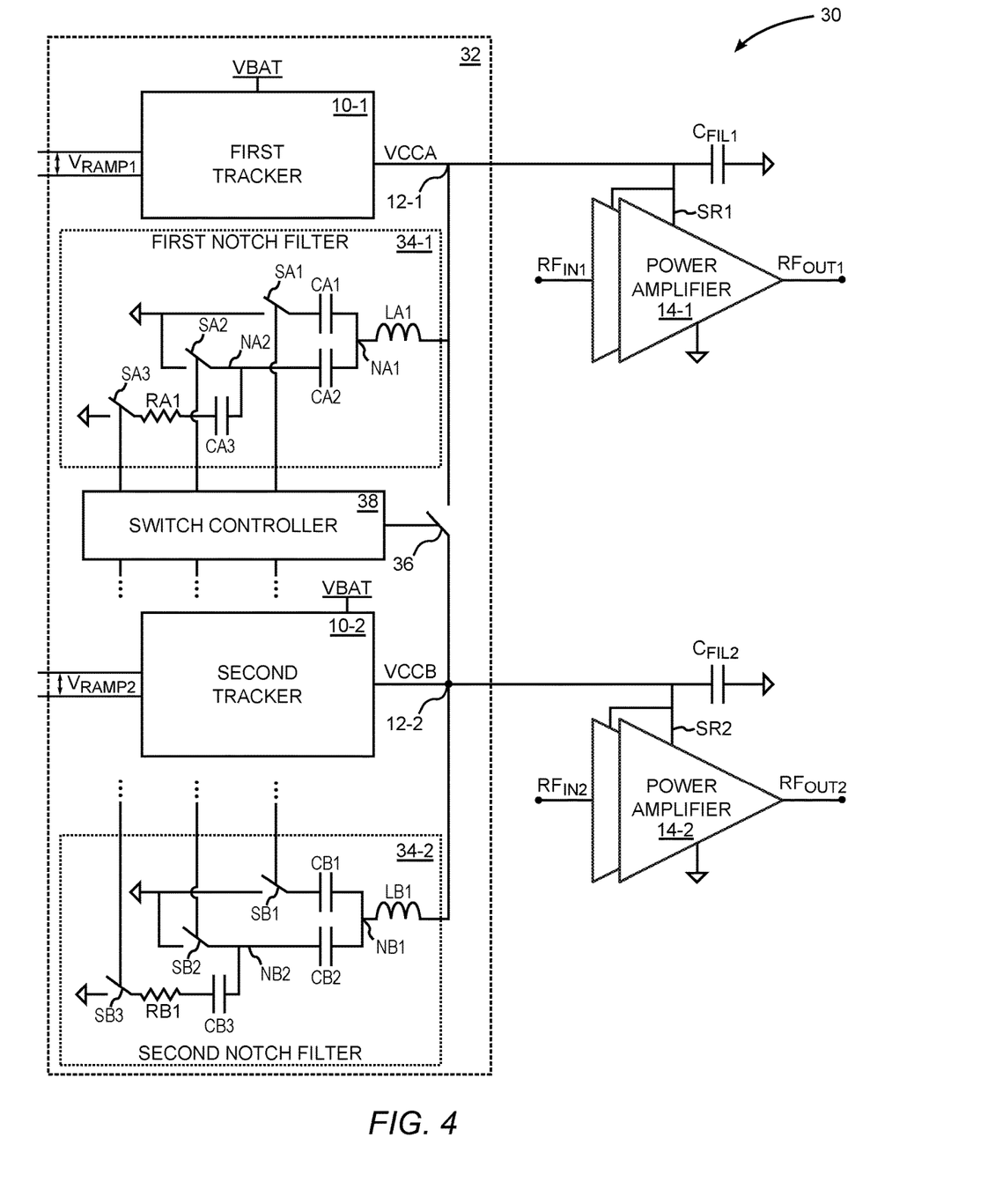
FIG. 4 is a block diagram that depicts an envelope tracking system that includes a dual tracker envelope tracking integrated circuit that integrates the first tracker with the second tracker and at least portions of notch filters to suppress noise from outputs of the first tracker and the second tracker.

In this regard, FIG. 4 is a diagram that depicts an envelope tracking system 30 that includes a dual tracker ETIC 32 that integrates the first tracker 10-1 and second tracker 10-2. The ETIC 32 has a first mode in which only one of the first tracker 10-1 and the second tracker 10-2 is supplying voltage (e.g., VCCA or VCCB) and a second mode in which the first tracker 10-1 and the second tracker 10-2 are both supplying voltages VCCA and VCCB, respectively. The ETIC 32 also includes a first notch filter 34-1 coupled between the first supply output 12-1 and a fixed voltage node such as ground. The ETIC 32 further includes a second notch filter 34-2 coupled between the second supply output 12-2 and the fixed voltage node. Topology of the first notch filter 34-1 and the second notch filter 34-2 is exemplary and is not limiting. Other notch filter topologies will occur to those skilled in the art.

A mode switch 36 is coupled between the first supply output 12-1 and the second supply output 12-2. The mode switch 36 is configured to receive a first switch control signal that closes the mode switch 36 to electrically couple the first notch filter 34-1 and the second notch filter 34-2 in parallel when the ETIC 32 is in the first mode and a second switch control signal that opens the mode switch 36 to electrically decouple the first notch filter 34-1 from the second notch filter 34-2 when the ETIC 32 is in the second mode.

A switch controller 38 is configured to generate the first switch control signal in response to the ETIC 32 operating in the first mode and generate the second control signal in response to the ETIC 32 operating in the second mode. In at least the exemplary embodiment of FIG. 3, the switch controller 38 is further configured to control opening and closing of other switches. For example, the exemplary first notch filter 34-1 has a first tuning switch SA1, a second tuning switch SA2, and a third tuning switch SA3, whereas the exemplary second notch filter 34-2 has a first tuning switch SB1, a second tuning switch SB2, and a third tuning switch SB3 that are each controlled independently by the switch controller 38.

In the exemplary embodiment depicted in FIG. 4, the first notch filter 34-1 includes an inductor LA1 that is coupled between the first supply output 12-1 and a first tuning node NA1. A first tuning capacitor CA1 and the first tuning switch SA1 are coupled in series between the first tuning node NA1 and the fixed voltage node, which in this case is ground. A second tuning capacitor CA2 and the second tuning switch SA2 are coupled in series between the first tuning node NA1 and the fixed voltage node. A third tuning capacitor CA3, a tuning resistor RA1, and the third tuning switch SA3 are coupled in series between a second tuning node NA2 and the fixed voltage node. The second tuning node NA2 is located between the second tuning capacitor CA2 and the second tuning switch SA2.

The second notch filter 34-2 includes an inductor LB1 that is coupled between the second supply output 12-2 and a first tuning node NB1. A first tuning capacitor CB1 and the first tuning switch SB1 are coupled in series between the first tuning node NB1 and the fixed voltage node, which in this case is ground. A second tuning capacitor CB2 and the second tuning switch SB2 are coupled in series between the first tuning node NB1 and the fixed voltage node. A third tuning capacitor CB3, a tuning resistor RB1, and the third tuning switch SB3 are coupled in series between a second tuning node NB2 and the fixed voltage node. The second tuning node NB2 is located between the second tuning capacitor CB2 and the second tuning switch SB2. It is to be understood that while the first notch filter 34-1 and the second notch filter 34-2 are depicted completely integrated within the ETIC 32, other embodiments can integrate some elements and leave other elements external to the ETIC 32. For example, the inductor LA1 and the inductor LB1 may be coupled respectively to the first notch filter 34-1 and the second notch filter 34-2 externally to the ETIC 32.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking system comprising:
   an envelope tracking integrated circuit (ETIC) having a first tracker with a first supply output and a second tracker with a second supply output, wherein the ETIC has a first mode in which only one of the first tracker and the second tracker is supplying voltage and a second mode in which the first tracker and the second tracker are both supplying voltage;
   a first notch filter coupled between the first supply output and a fixed voltage node;
   a second notch filter coupled between the second supply output and the fixed voltage node; and
   a mode switch coupled between the first supply output and the second supply output, wherein the mode switch is configured to receive a first switch control signal that closes the mode switch to electrically couple the first notch filter and the second notch filter in parallel when the ETIC is in the first mode and a second switch control signal that opens the mode switch to electrically decouple the first notch filter from the second notch filter when the ETIC is in the second mode.

2. The envelope tracking system of claim 1 wherein the fixed voltage node is ground.

3. The envelope tracking system of claim 1 further comprising a switch controller configured to generate the first switch control signal in response to the ETIC operating in the first mode and generate the second switch control signal in response to the ETIC operating in the second mode.

4. The envelope tracking system of claim 3 wherein the switch controller and the mode switch are integrated into the ETIC.

5. The envelope tracking system of claim 3 wherein the first notch filter comprises tuning components selectively coupled between the first supply output and the fixed voltage node through one or more tuning switches.

6. The envelope tracking system of claim 5 wherein the switch controller is further configured to control opening and closing of the one or more tuning switches of the first notch filter.

7. The envelope tracking system of claim 5 wherein the one or more tuning switches and at least some of the tuning components of the first notch filter are integrated into the ETIC.

8. The envelope tracking system of claim 3 wherein the second notch filter comprises tuning components selectively coupled between the second supply output and the fixed voltage node through one or more tuning switches.

9. The envelope tracking system of claim 8 wherein the switch controller is further configured to control opening and closing of the one or more tuning switches of the second notch filter.

10. The envelope tracking system of claim 9 wherein the one or more tuning switches and at least some of the tuning components of the second notch filter are integrated into the ETIC.

11. The envelope tracking system of claim 1 further comprising a first power amplifier having a first supply rail coupled to the first supply output and a second power amplifier having a second supply rail coupled to the second supply output.

12. The envelope tracking system of claim 11 wherein the first power amplifier and the second power amplifier are both radio frequency (RF) power amplifiers.

13. The envelope tracking system of claim 1 wherein the first tracker comprises a multi-level charge pump system configured to supply voltage at the first supply output.

14. The envelope tracking system of claim 1 wherein the first tracker comprises a first parallel amplifier having:
 a first amplifier input terminal coupled to the first supply output to receive a first feedback signal;
 a second amplifier input terminal configured to receive a first envelope tracking signal; and
 an output terminal communicatively coupled to the first supply output, wherein the first parallel amplifier is configured to provide a first modulated supply voltage at the first supply output in response to a difference between the first envelope tracking signal and the first feedback signal.

15. The envelope tracking system of claim 14 further including a capacitor coupled between the output terminal of the first parallel amplifier and the first supply output.

16. The envelope tracking system of claim 14 wherein the first tracker further comprises a first micro-buck/boost charge pump system configured to power the first parallel amplifier.

17. The envelope tracking system of claim 1 wherein the second tracker comprises a multi-level charge pump system configured to supply voltage at the second supply output.

18. The envelope tracking system of claim 1 wherein the second tracker comprises a second parallel amplifier having:
 a first amplifier input terminal coupled to the second supply output to receive a second feedback signal;
 a second amplifier input terminal configured to receive a second envelope tracking signal; and
 an output terminal communicatively coupled to the second supply output, wherein the second parallel amplifier is configured to provide a second modulated supply voltage at the second supply output in response to a difference between the second envelope tracking signal and the feedback signal.

19. The envelope tracking system of claim 18 wherein the second tracker further comprises a second micro-buck/boost charge pump system configured to power the second parallel amplifier.

20. The envelope tracking system of claim 18 further including a capacitor coupled between the output terminal of the second parallel amplifier and the second supply output.

* * * * *